(12) United States Patent
Lu et al.

(10) Patent No.: US 7,755,435 B2
(45) Date of Patent: Jul. 13, 2010

(54) WIDEBAND LOW NOISE AMPLIFIERS

(75) Inventors: Shey-Shi Lu, Taipei (TW); Hsien-Ku Chen, Taipei (TW)

(73) Assignee: National Taiwan University, Taipei (TW)

( * ) Notice: Subject to any disclaimer, the term of this patent is extended or adjusted under 35 U.S.C. 154(b) by 49 days.

(21) Appl. No.: 12/030,808

(22) Filed: Feb. 13, 2008

(65) Prior Publication Data

US 2009/0121791 A1 May 14, 2009

(30) Foreign Application Priority Data

Nov. 12, 2007 (TW) ............................... 96142685 A

(51) Int. Cl.
*H03F 3/68* (2006.01)
(52) U.S. Cl. ..................................................... 330/311
(58) Field of Classification Search ......... 330/310–311, 330/283, 98, 305–306
See application file for complete search history.

(56) References Cited

U.S. PATENT DOCUMENTS 5,491,450 A * 2/1996 Helms et al. ................. 330/277

| 6,556,085 B2 * | 4/2003 | Kwon et al. ................. 330/311 |
| 6,731,175 B1 * | 5/2004 | Chen .......................... 330/311 |
| 7,202,749 B2 * | 4/2007 | Mohammadi ............... 330/307 |
| 7,489,201 B2 * | 2/2009 | Sarkar et al. ................ 330/311 |

OTHER PUBLICATIONS

Hsien-Ku Chen et al. "A Compact Wideband CMOS Low-Noise Amplifier Using Shunt Resistive-Feedback and Series Inductive-Peaking Techniques". IEEE Microwave and Wireless Components Letters, Aug. 2007, 3 pages, vol. 17, No. 8, USA.

* cited by examiner

*Primary Examiner*—Robert Pascal
*Assistant Examiner*—Hieu P Nguyen
(74) *Attorney, Agent, or Firm*—Quintero Law Office

(57) ABSTRACT

A wideband low noise amplifier. The wideband low noise amplifier comprises an amplifier, an output device, and an inductor. The amplifier amplifies an input signal received from an input node, and outputs the amplified signal to an output node. The output device is coupled to a first voltage and the output node. The peaking inductor is coupled between the amplifier and the output device.

16 Claims, 6 Drawing Sheets

WIDEBAND LOW NOISE AMPLIFIERS

BACKGROUND OF THE INVENTION

1. Field of the Invention

The invention relates to a wideband low noise amplifier, and more particularly to an ultra-wideband (UWB) low noise amplifier.

2. Description of the Related Art

Recently, wideband systems with high frequency transmission capabilities have become more and more popular. For example, ultra-wideband (UWB) system using 3.1 GHz to 10.6 GHz transmission bands offering faster speed and wireless transmission capabilities. Along with development of wideband technology, the bandwidth of the elements adopted in the wideband systems must also be extended. For example, a low noise amplifier (LNA) disposed between an antenna and pre-select filter in the UWB system requires a 50Ω input resistance and 3.1 GHz to 10.6 GHz bandwidth design.

FIG. 1 shows a conventional low noise amplifier 10, which is a type of distributed amplifier (DA). Because the frequency response of a DA can be extended to a direct current (DC) part and there is a good match between the input-output resistances, the distributed low noise amplifier 10 is now widely used in wideband systems. However, the distributed low noise amplifier 10 requires a large chip area and high power consumption. FIG. 2 shows another conventional low noise amplifier 20, which is a type of cascode CMOS LNA. Cascode CMOS LNA 20 includes a bandpass filter in the input end for providing a good wideband match of the input resistance and wideband frequency response. However, since the bandpass filter in the input end requires lots of inductors and capacitors, the cascode CMOS LNA 20 has large noise figure (NF) and requires a large chip area when implemented. To achieve a wideband match with low noise dissipation and smaller chip area, common gate input topology has been developed. FIG. 3 is another conventional low noise amplifier 30, which is a common gate LNA. However, the gain of the common gate LNA 30 is small and NF of the common gate LNA 30 is large when compared to a common source amplifier.

Thus, an improved wideband low noise amplifier with low power consumption, wideband resistance match and a small chip area for a UWB system is required.

BRIEF SUMMARY OF THE INVENTION

Wideband low noise amplifiers are provided. An exemplary embodiment of such a wideband low noise amplifier comprises an amplifier, an output device and a peaking inductor. The amplifier amplifies an input signal received from a signal input terminal, and outputs an amplified signal to a signal output terminal. The output device is coupled to a first power supply and the signal output terminal. The peaking inductor is coupled between the amplifier and the output device.

An exemplary embodiment of a wideband low noise amplifier for amplifying an input signal received from a signal input terminal and outputting an amplified signal to a signal output terminal comprises a first transistor, a transmission line, an output device, a first resistor, a second transistor and a first inductor. The first transistor comprises a gate coupled to the signal input terminal. The transmission line is coupled between a source of the first transistor and a ground node. The output device is coupled to a first power supply and the signal output terminal. The first resistor is coupled between the gate of the first transistor and the output device. The second transistor comprises a gate coupled to a second power supply, and a source coupled to a drain of the first transistor. The first inductor is coupled between a drain of the second transistor and a first connection node of the first resistor and the output device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
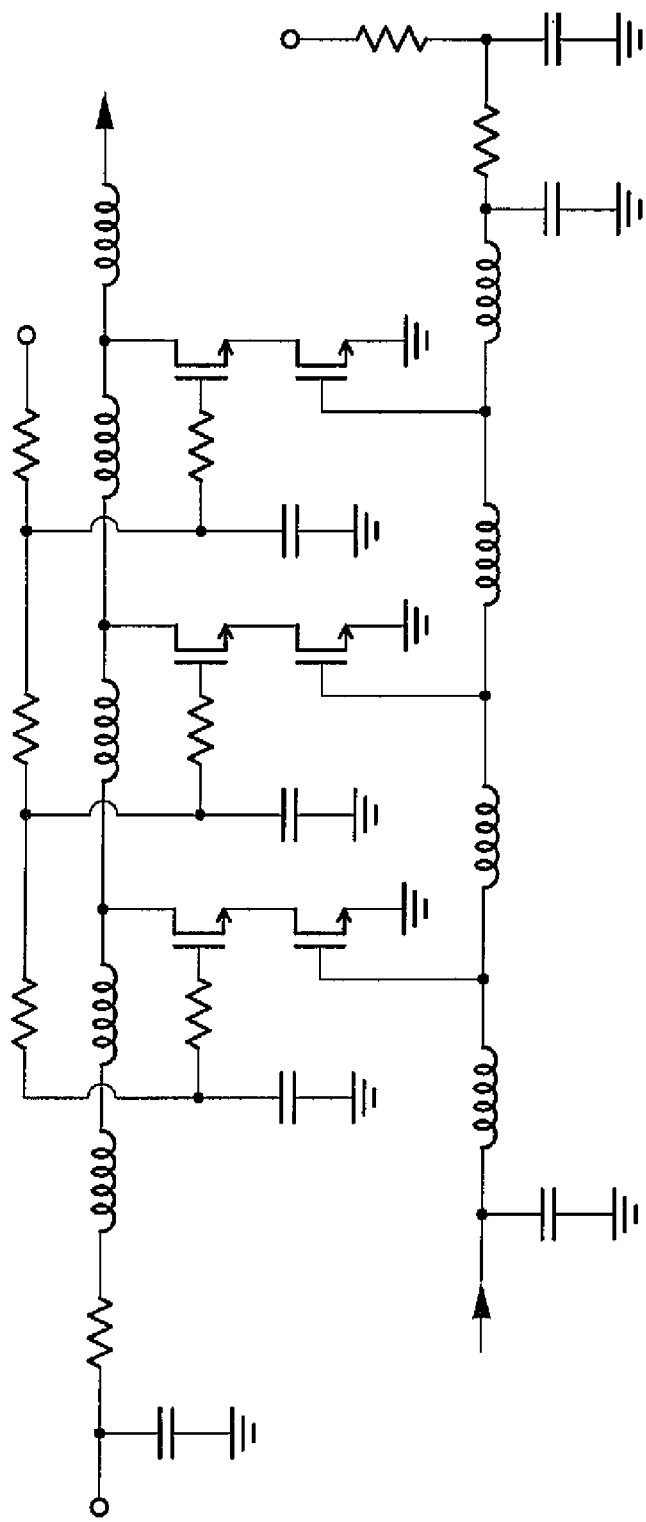
FIG. 1 shows a conventional low noise amplifier.
Figure 2:
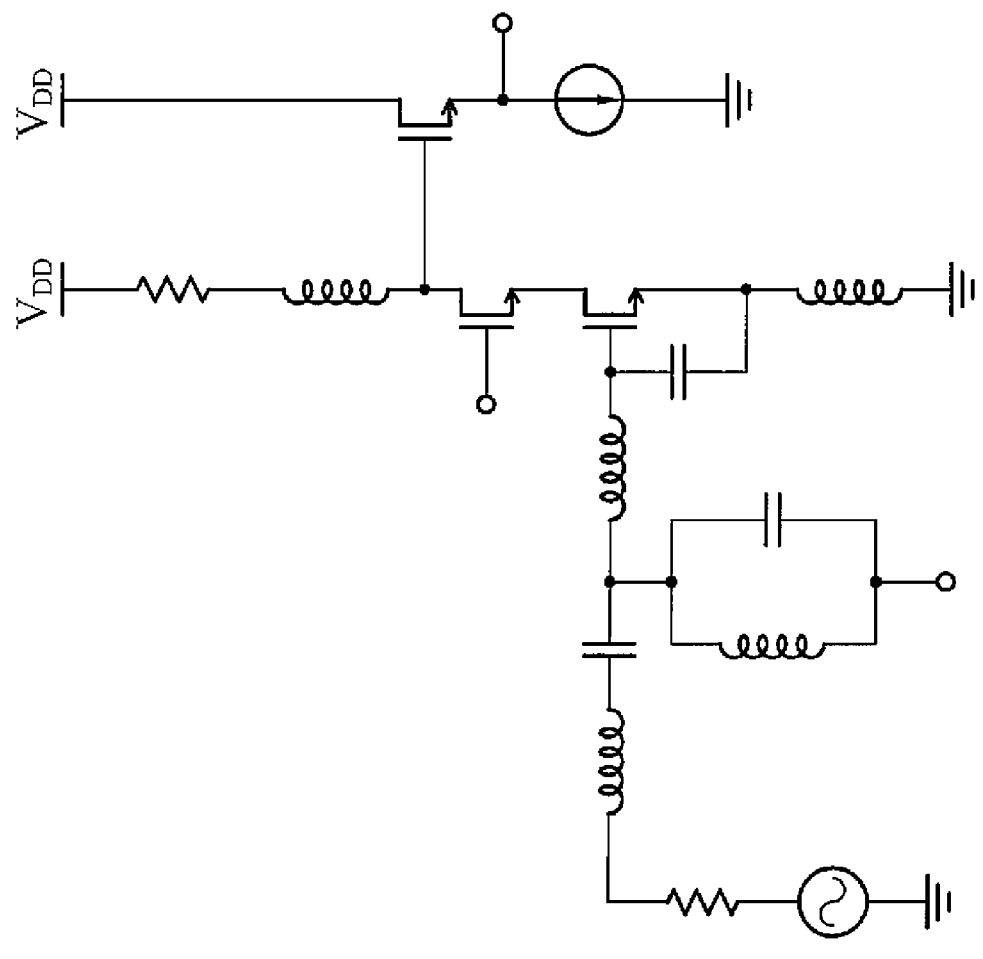
FIG. 2 shows another conventional low noise amplifier.
Figure 3:
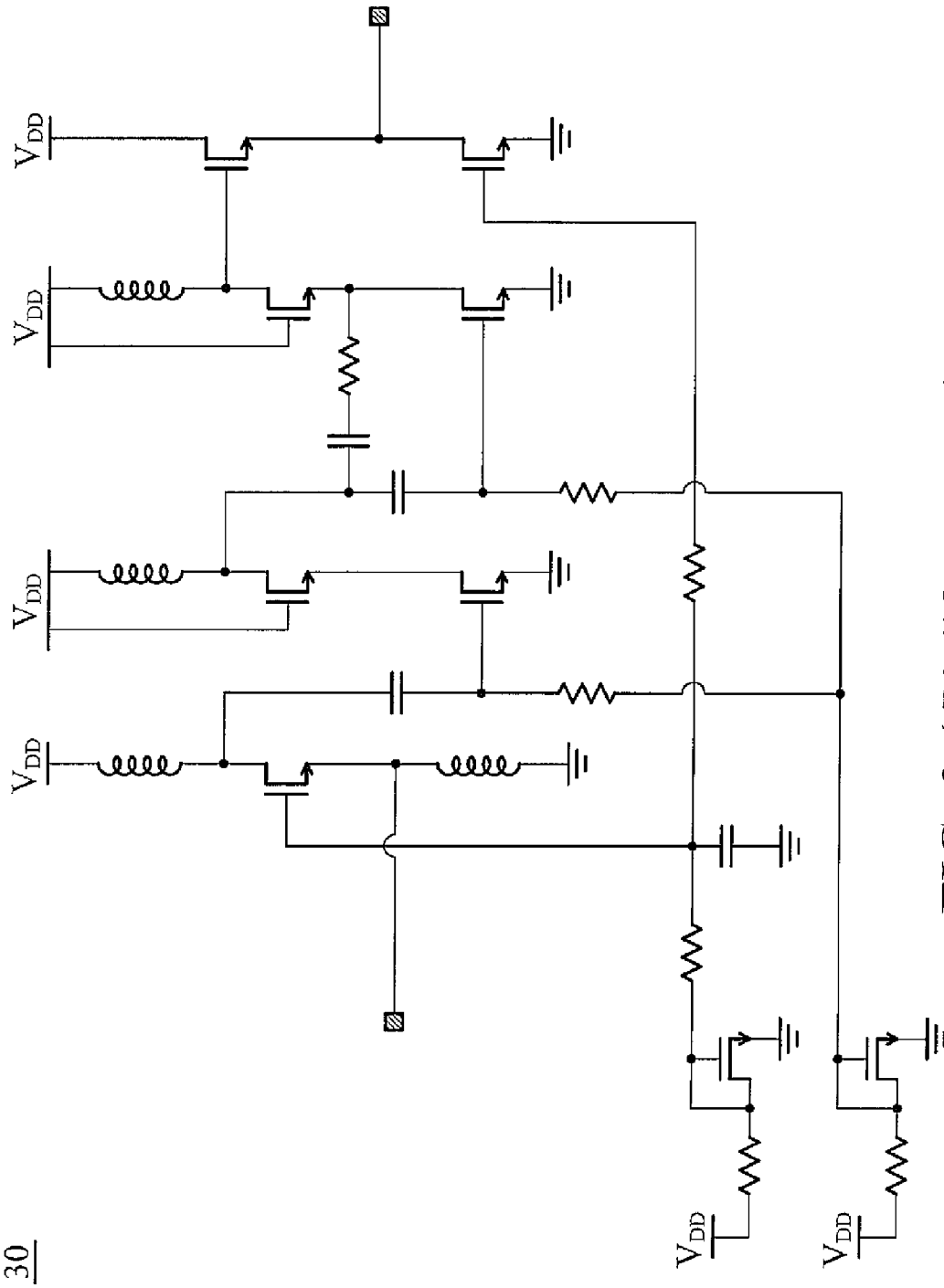
FIG. 3 shows another conventional low noise amplifier.
Figure 4:
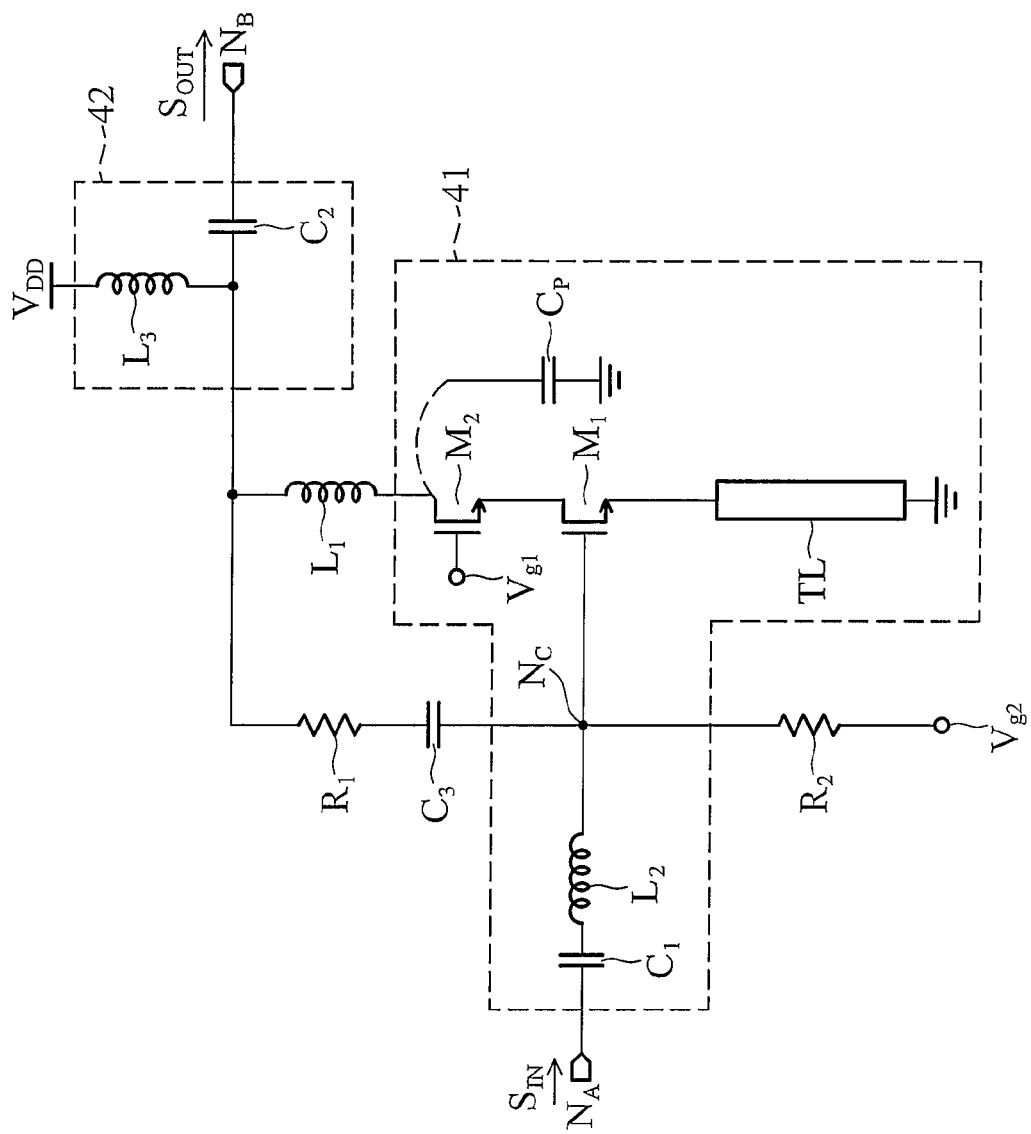
FIG. 4 shows a wideband low noise amplifier according to one embodiment of the invention.

FIG. 4 is a wideband low noise amplifier 40 according to one embodiment of the invention. Wideband low noise amplifier 40 comprises an amplifier 41 for amplifying an input signal $S_{IN}$ received from a signal input terminal $N_A$, and outputting an amplified signal $S_{OUT}$ to a signal output terminal $N_B$, and an output device 42 coupled to a power supply $V_{DD}$ and the signal output terminal $N_B$. According to the embodiment, wideband low noise amplifier 40 further comprises a peaking inductor $L_1$ series coupled between the amplifier 41 and the output device 42. As shown in FIG. 4, the amplifier 41 comprises capacitor $C_1$, transistor $M_1$ and $M_2$, inductor $L_2$, and transmission line TL. Capacitor $C_1$ is coupled to the signal input terminal $N_A$. Inductor $L_2$ is coupled between the capacitor $C_1$ and a gate of the transistor $M_1$. The gate of the transistor $M_2$ is coupled to a power supply $V_{g1}$, and the source of the transistor $M_2$ is coupled to the drain of the transistor $M_1$. The transmission line TL is coupled between the source of the transistor $M_1$ and a ground. The output device 42 is an external RF chock for outputting the amplified output signal. The output device 42 comprises an inductor $L_3$ coupled to the power supply $V_{DD}$, and a capacitor $C_2$ coupled between the inductor $L_3$ and the signal output terminal $N_B$. Wideband low noise amplifier 40 further comprises capacitor $C_3$ and resistors $R_1$ and $R_2$. Capacitor $C_3$ is coupled to a connection node $N_C$ of the inductor $L_2$ and the gate of the transistor $M_1$. Resistor $R_1$ is coupled between the capacitor $C_3$ and the peaking inductor $L_1$. Resistor $R_2$ is coupled between the connection node $N_C$ and power supply $V_{g2}$. According to one embodiment of the invention, transmission line TL is an inductor.

Figure 5:
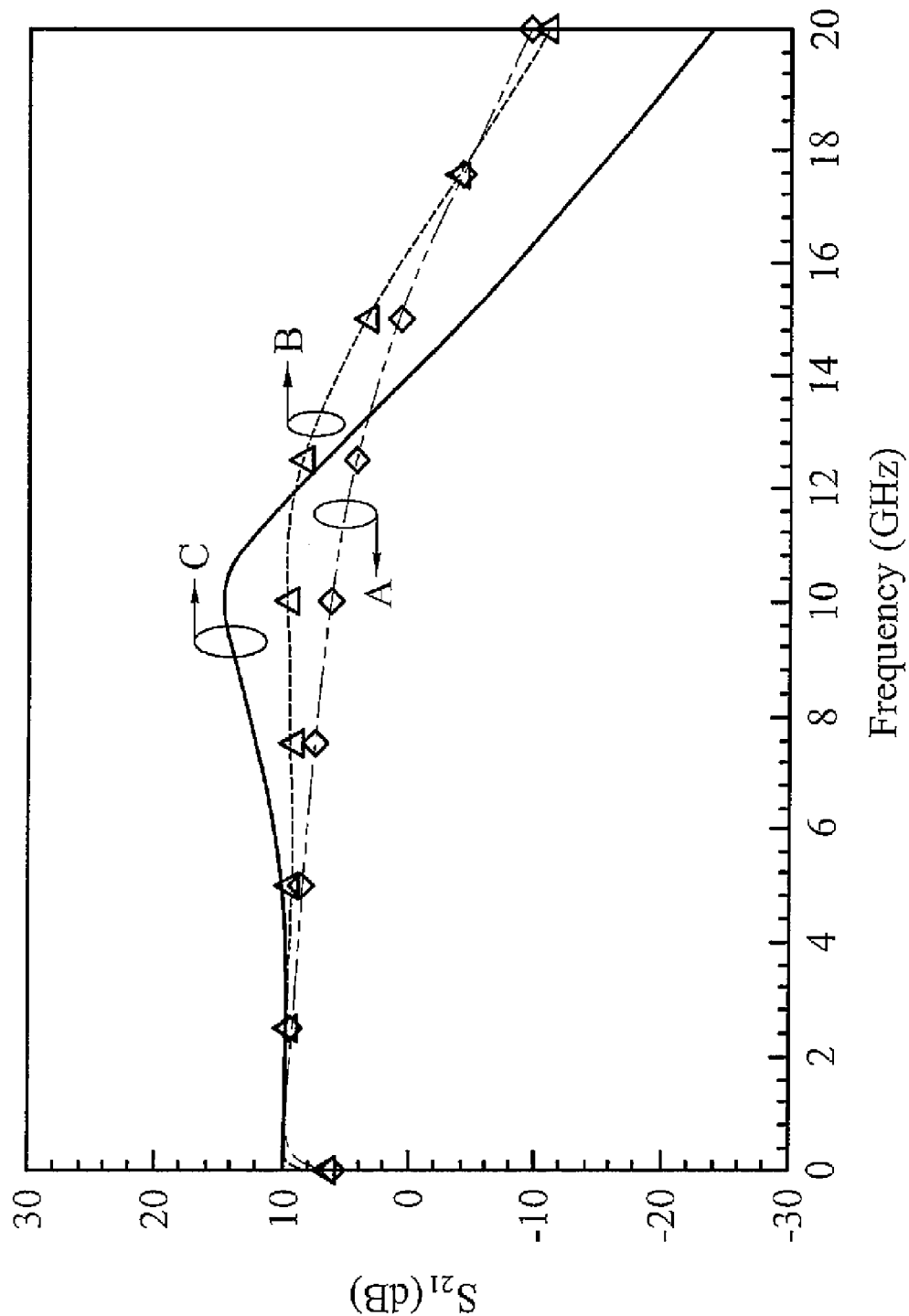
FIG. 5 shows several frequency responses of the transmission coefficients S21 of the wideband low noise amplifier according to the embodiments of the invention with different peaking inductors.
Figure 6:
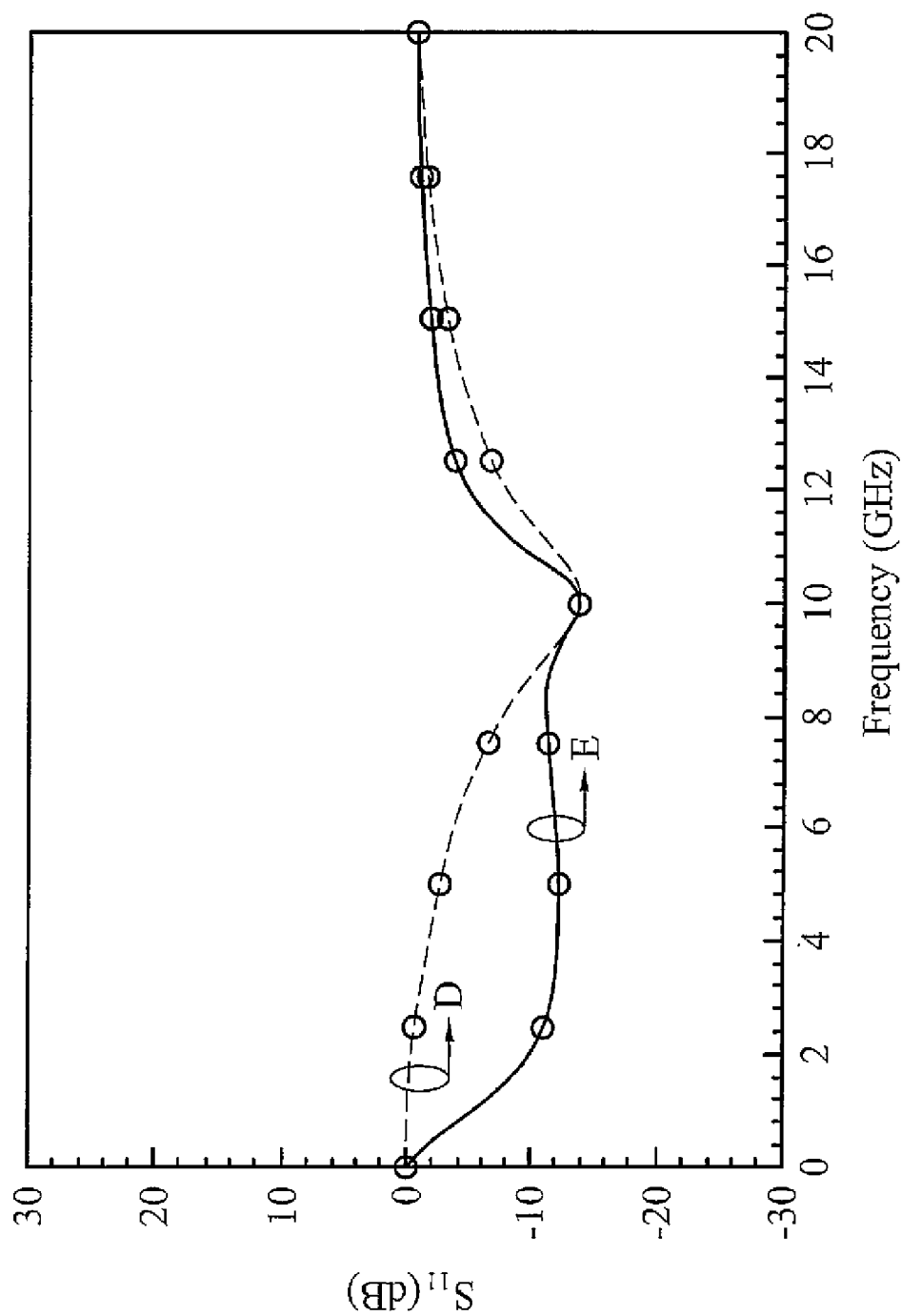
FIG. 6 shows the frequency responses of the reflection coefficients S11 of the wideband low noise amplifier according to the embodiments of the invention with different feedback resistor.

Because resonant circuit with capacitor and inductor connected in serial is used at the input terminal of the amplifier 41, the amplifier 41 obtains higher quality factor. Higher quality factor makes the frequency response of the reflection factor S11 act like a narrow band bandpass filter, which restrains the bandwidth of amplifier 41. Furthermore, the parasitism capacitor $C_{gs}$, $C_{gd}$, $C_{db}$, and $C_{sb}$ of transistors $M_1$ and $M_2$ are also factors that restrain the bandwidth of amplifier 41. Thus, according to one embodiment of the invention, a feedback resistor $R_1$ is used to decrease the quality factor of amplifier 41. According to the embodiment of the invention, the resistance of the feedback resistor $R_1$ can be chosen between 100Ω-500Ω, wherein when the resistance of the feedback resistor $R_1$ is 300Ω, the frequency response of the reflection factor S11 of the wideband low noise amplifier 40 is more preferable. Furthermore, in order to increase the power gain of the amplifier 41 at high frequency area, a peaking inductor $L_1$ coupled between the inductor $L_3$ and the drain of transistor $M_2$ is used to extend the bandwidth of the amplifier 41. By using series peaking inductor $L_1$, peaking inductor $L_1$ resonate with the parasitism capacitor $C_p$ at the drain of transistor $M_2$. In this way, the gain of the wideband low noise amplifier 40 is increased at the corresponding resonant frequency. Thus, the bandwidth of the wideband low noise amplifier 40 can be effectively extended by properly selecting the inductance of peaking inductor $L_1$. According to one embodiment of the invention, the inductance of the peaking inductor $L_1$ is preferably between 0.1 nH-1.13 nH. However, the inductance of the peaking inductor $L_1$ can be larger than 1.13 nH according to different circuit requirements. FIG. 5 shows several frequency responses of the transmission coefficients S21 of the wideband low noise amplifier 40 according to the embodiments of the invention with different peaking inductors $L_1$, wherein the x-axis represents the frequency of the input signal, y-axis represents the transmission coefficients S21, line A is the frequency response of S21 when the peaking inductor $L_1$ is removed, line B is the frequency response of S21 when the inductance of the peaking inductor $L_1$ is 0.619 nH, and line C is the frequency response of S21 when the inductance of the peaking inductor $L_1$ is 1.13 nH. As shown in FIG. 5, when the peaking inductor $L_1$ is removed, S21 starts to drop from about 4.2 GHz. When the inductance of the peaking inductor $L_1$ is 1.13 nH, S21 is pulled up from about 4.2 GHz, and is extended to drop from about 10 GHz. Because of such kind of "pull up" effect, the inductor $L_1$ is thus called the "peaking inductor". When the inductance of the peaking inductor $L_1$ is 0.69 nH, S21 is further extended to drop from about 11.5 GHz, and as shown in FIG. 5, the frequency response of S21 is flatter and the bandwidth is wider. FIG. 6 shows the frequency responses of the reflection coefficients S11 of the wideband low noise amplifier 40 according to the embodiments of the invention with different feedback resistor $R_1$, wherein the x-axis represents the frequency of the input signal, y-axis represents the reflection coefficients S11, line D is the frequency response of S11 when the feedback resistor $R_1$ is removed, line E is the frequency response of S11 when the resistance of the feedback resistor $R_1$ is 300Ω. Because there is a 50Ω best match when the reflection coefficients S11 is about −10 dB, we can focus on the frequency response at about −10 dB. From FIG. 6, it can be seen that in line D, the reflection coefficients S11 is about −10 dB only within the frequency range from 9.5 GHz to 11 GHz. However, in line E, the reflection coefficients S11 can be maintained −10 dB within the frequency range from 2 GHz to 11.5 GHz. It is proved that the use of a 300Ω feedback resistor $R_1$ is able to reduce the quality factor and provide better input match when the frequency of the input signal is within 2 GHz to 11.5 GHz. According to the embodiment of the invention, the resistance of resistors $R_1$ and $R_2$ can be selected between 300Ω-2000Ω, and the capacitance of the capacitors $C_1$ and $C_3$ can be selected between 3 pF-10 pF. Additionally, the inductance of the inductors $L_1$ and $L_2$ can be selected between 0.1 nH-2 nH, the inductance of the transmission line can be selected between 0.1 nH-0.5 nH when it is an inductor, the voltage $V_{DD}$ can be selected between 1V-1.5V, the voltage $V_{g1}$ can be selected between 0.9V-1.5V, and the voltage $V_{g2}$ can be selected between 0.55V-0.9V. The inductor $L_3$ in the RF chock is a large inductor and the inductance is about 2 μF, and the capacitance of the capacitor $C_2$ is about 800 nF.

According to the embodiment of the invention, the wideband low noise amplifier 40 can be implement by 1P6M 0.18 μm CMOS technology, and the die area including the testing pad only requires 0.48×0.69 m². Thus, according to the embodiment of the invention, the wideband low noise amplifier 40 not only has low power consumption, high gain, better input match, but also has wider frequency response and requires smaller a chip area. Thus, both the chip area and the cost of the low noise amplifier can be effectively reduced.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A wideband low noise amplifier, comprising:
    an amplifier for amplifying an input signal received from a signal input terminal, and outputting an amplified signal to a signal output terminal;
    an output device coupled to a first power supply and the signal output terminal;
    a first inductor coupled between the amplifier and the output device; and
    a first resistor coupled between the signal input terminal and the signal output terminal,
    wherein the amplifier comprises:
    a first capacitor coupled to the signal input terminal;
    a first transistor;
    a second inductor coupled between the first capacitor and a gate of the first transistor;
    a second transistor comprising a gate coupled to a second power supply, and a source coupled to a drain of the first transistor; and
    a transmission line coupled between a source of the first transistor and a ground.

2. The wideband low noise amplifier as claimed in claim 1, wherein the output device comprises:
    a third inductor coupled to the first power supply; and
    a second capacitor coupled between the third inductor and the signal output terminal.

3. The wideband low noise amplifier as claimed in claim 2, wherein the first inductor is coupled between a drain of the second transistor and the third inductor.

4. The wideband low noise amplifier as claimed in claim 3, further comprising:
    a third capacitor coupled to a connection node of the second inductor and the gate of the first transistor, wherein the first resistor is coupled between the third capacitor and the first inductor; and
    a second resistor coupled between the connection node and a third power supply.

5. The wideband low noise amplifier as claimed in claim 1, wherein the inductance of the first inductor is between 0.1 nH-2 nH.

6. The wideband low noise amplifier as claimed in claim 4, wherein the resistance of the first resistor is between 300Ω-2000Ω.

7. The wideband low noise amplifier as claimed in claim 1, wherein the transmission line is an inductor.

8. The wideband low noise amplifier as claimed in claim 1, wherein the frequency of the input signal is between 2 GHz-11.5 GHz.

9. The wideband low noise amplifier as claimed in claim 1, wherein the first resistor is coupled between the output device and the gate of the first transistor.

10. A wideband low noise amplifier for amplifying an input signal received from a signal input terminal, and outputting an amplified signal to a signal output terminal, comprising:
   a first transistor comprising a gate coupled to the signal input terminal;
   a transmission line coupled between a source of the first transistor and a ground node;
   an output device coupled to a first power supply and the signal output terminal;
   a first resistor coupled between the gate of the first transistor and the output device;
   a second transistor comprising a gate coupled to a second power supply, and a source coupled to a drain of the first transistor; and
   a first inductor coupled between a drain of the second transistor and a first connection node of the first resistor and the output device.

11. The wideband low noise amplifier as claimed in claim 10, further comprising:
   a first capacitor coupled to the signal input terminal;
   a second inductor coupled between the first capacitor and the gate of the first transistor;
   a second capacitor coupled between the first resistor and a second connection node of the second inductor and the gate of the first transistor; and
   a second resistor coupled between the second connection node and a third power supply.

12. The wideband low noise amplifier as claimed in claim 10, wherein the output device comprises:
   a third inductor coupled between the first power supply and the first inductor; and
   a third capacitor coupled between the third inductor and the signal output terminal.

13. The wideband low noise amplifier as claimed in claim 10, wherein the inductance of the first inductor is between 0.1 nH-2 nH.

14. The wideband low noise amplifier as claimed in claim 10, wherein the resistance of the first resistor is between 300Ω-2000Ω.

15. The wideband low noise amplifier as claimed in claim 10, wherein the transmission line is an inductor.

16. The wideband low noise amplifier as claimed in claim 10, wherein the frequency of the input signal is between 2 GHz-11.5 GHz.

* * * * *